(12) United States Patent
Goyal

(10) Patent No.: US 9,472,701 B2
(45) Date of Patent: Oct. 18, 2016

(54) SYSTEMS AND METHODS FOR WIRING SOLAR PANEL ARRAYS

(71) Applicant: Rahul Natwar Goyal, Tyrone, GA (US)

(72) Inventor: Rahul Natwar Goyal, Tyrone, GA (US)

(73) Assignee: Cooper Technologies Company, Houston, TX (US)

( * ) Notice: Subject to any disclaimer, the term of this patent is extended or adjusted under 35 U.S.C. 154(b) by 0 days.

(21) Appl. No.: 14/874,703

(22) Filed: Oct. 5, 2015

(65) Prior Publication Data

US 2016/0027945 A1    Jan. 28, 2016

Related U.S. Application Data

(63) Continuation of application No. 13/664,208, filed on Oct. 30, 2012, now Pat. No. 9,153,710.

(51) Int. Cl.
*H01L 31/05*    (2014.01)
*H01L 31/04*    (2014.01)
*H01L 31/02*    (2006.01)

(52) U.S. Cl.
CPC ..... *H01L 31/0504* (2013.01); *H01L 31/02021* (2013.01); *H01L 31/04* (2013.01); *H01L 31/05* (2013.01); *Y02E 10/50* (2013.01); *Y10T 29/49117* (2015.01); *Y10T 307/685* (2015.04)

(58) Field of Classification Search
CPC . H01L 31/02021; H01L 31/04; H01L 31/05; H01L 31/0504; Y02E 10/50
See application file for complete search history.

(56) References Cited

U.S. PATENT DOCUMENTS

| | | |
|---|---|---|
| 2005/0012021 A1 | 1/2005 | Middelman et al. |
| 2008/0210286 A1 | 9/2008 | Ball |
| 2009/0078299 A1 | 3/2009 | Cinnamon et al. |
| 2009/0302680 A1 | 12/2009 | Kernahan et al. |
| 2011/0220180 A1 | 9/2011 | Cinnamon et al. |

*Primary Examiner* — Zeev V Kitov
(74) *Attorney, Agent, or Firm* — King & Spalding LLP

(57) ABSTRACT

A solar power system may include a combiner module, one or more rows of solar panels connected to the combiner module, and one or more wiring circuits connecting the one or more rows of solar panels to the combiner module. Each circuit may include an inter-module wiring arrangement that connects individual solar panels to each other in series, and a return wiring arrangement that connects the inter-module wiring arrangement to the combiner module. Each inter-module wiring arrangement may be arranged such that at least some solar panels are wired to other solar panels in the same row in a substantially alternating manner, such that non-adjacent solar panels in the same row are wired directly in series to each other. This arrangement may reduce the total length of harness wires needed to connect the one or more panel rows to the combiner box, as compared with conventional wiring schemes.

20 Claims, 9 Drawing Sheets

SYSTEMS AND METHODS FOR WIRING SOLAR PANEL ARRAYS

PRIORITY CLAIM

The present application is a continuation application under 35 U.S.C. §120 and claims priority to U.S. patent application Ser. No. 13/664,208, filed on Oct. 30, 2012, and titled "Systems and Methods for Wiring Solar Panel Arrays," the entire content of which is incorporated herein by reference.

TECHNICAL FIELD

The present application relates generally to solar power systems and more particularly to systems and methods for wiring solar panel arrays, e.g., to reduce installation time and/or wiring lengths.

BACKGROUND

Photovoltaic power generation systems, often referred to as "solar power systems," are increasing in popularity as a "clean" or "green" energy source, as an alternative to fossil fuels and other energy sources. A photovoltaic power generation system typically includes an array of photovoltaic (PV) cells, referred to as solar cells or solar panels, connected in series and/or in parallel.

A typical solar array install includes groups, or "clusters," of solar panels are connected in series and then connected to a junction box, called a "combiner box" or simply a "combiner." Each panel cluster may be connected to the combiner box by a pair of wires referred to as a wire harness. The combiner receives wire harnesses from multiple solar panel clusters and merges these wires into high-gauge wires that carry direct current (DC) from the solar panel clusters to an inverter system and other downstream components of the solar power system. Typically, the individual solar panels in a panel cluster are wired to each other using "pigtails" that are pre-connected to each solar panel (e.g., included during the panel fabrication process), and then return wiring, in the form of one or more wire harnesses, is used to connect the cluster to the combiner box. The wiring pigtail provided on each solar panel may include a pair of wires such that each panel can be connected in series between two other solar panels (or in the case of an end panel, between another solar panel and a wire harness returning to the combine box). The wiring pigtails and return wiring (e.g., wire harnesses) combine to form a wiring circuit connecting a solar panel cluster to the combiner box.

FIG. 1 illustrates one example of a conventional wiring scheme for a cluster in a solar array. In this example, 6 solar panels, labeled P1 through P6, are arranged in a row 20. In this arrangement, the solar panels are arranged in a landscape orientation, i.e., with the longer dimension of the individual panels extending along the direction of the respective panel row. A wiring circuit is arranged to connect the solar panels P1-P6 to a combiner module 50, e.g., a combiner box or other system component or node for combining the wiring of multiple solar panel clusters and/or arrays. In this scheme, wiring circuit 30 includes an inter-module wiring arrangement 32 that connects panels P1-P6 to each other in series, and a return wire harness 34 that connects the inter-module wiring arrangement 32 to the combiner box 50.

The inter-module wiring arrangement 32 of circuit 30 is formed by connecting wiring pigtails 36—typically pre-connected to each solar panel—to each other to connect the solar panels of row 20 to each other in series. Each wiring pigtail 36 may include a pair of pigtail leads 38A and 38B connected to a junction box 35 on the respective solar panel. As shown in FIG. 1, the pigtail lead 38A of one solar panel is connected to pigtail lead 38B of an adjacent solar panel. Return wire harness 34 includes a pair of harness wires 40 coupled to the ends of the inter-module wiring arrangement 32. Thus, return wire harness 34 includes a first harness wire 40A connected to a pigtail lead 38A of panel P1 at one end of the inter-module wiring arrangement 32, and a second harness wire 40B connected to a pigtail lead 38B of panel P6 at the other end of the inter-module wiring arrangement 32.

In this document, a solar panel is "adjacent" to another solar panel only if it is the closest solar panel on either side of the reference solar panel in the same row as the reference panel, regardless of the actual distance between solar panels. Thus, with respect to FIG. 1, panels P2 and P4 are adjacent to panel P3, while panels P1 and P5 are not adjacent panel P3, regardless of the actual distance between any of the respective panels.

FIG. 2 illustrates an example of a conventional wiring scheme for a pair of clusters in a solar array. Essentially, each of the clusters uses the wiring scheme shown in FIG. 1, as described below.

In this example, 12 solar panels, labeled P1 through P12, are arranged in two rows 20A and 20B, with each row including 6 solar panels (row 20A includes panels 1-6, while row 20B includes panels 7-12). The solar panels are arranged in a landscape orientation. A pair of wiring circuits 30A and 30B connect the solar panels P1-P12 to a combiner module 50. Wiring circuit 30A is provided for a first panel cluster (panels P1-P6) and includes an inter-module wiring arrangement 32A that connects the solar panels of row 20A (panels P1-P6) to each other in series, and a return wire harness 34A that connects the inter-module wiring arrangement 32A to the combiner box 50. Similarly, wiring circuit 30B is provided for a second panel cluster (panels P7-P12) includes an inter-module wiring arrangement 32B that connects the solar panels of row 20B (panels P7-P12) to each other in series, and a return wire harness 34B that connects the inter-module wiring arrangement 32B to the combiner box 50.

The inter-module wiring arrangement 32A/32B of each circuit 30A/30B is formed by connecting wiring pigtails 36 to each other to connect the solar panels of the respective row 20A/20B to each other in series. As shown in FIG. 2, the pigtail lead 38A of one solar panel is connected to pigtail lead 38B of an adjacent solar panel. Each return wire harness 34 includes a pair of harness wires 40 coupled to the ends of the respective inter-module wiring arrangement 32A/32B. Thus, return wire harness 34A includes a first harness wire 40A connected to a pigtail lead 38A of panel P1 at one end of the inter-module wiring arrangement 32A, and a second harness wire 40B connected to a pigtail lead 38B of panel P6 at the other end of the inter-module wiring arrangement 32A. Similarly, return wire harness 34B includes a first harness wire 40C connected to a pigtail lead 38A of panel P12 at one end of the inter-module wiring arrangement 32B, and a second harness wire 40D connected to a pigtail lead 38B of panel P7 at the other end of the inter-module wiring arrangement 32B.

As discussed above, in this document, a solar panel is "adjacent" to another solar panel only if it is the closest solar panel on either side of the reference solar panel in the same row as the reference panel, regardless of the actual distance between solar panels. Thus, with respect to FIG. 2, panels P2 and P4 are adjacent to panel P3, while panels P1, P5, and P10 are not adjacent panel P3, regardless of the actual distance between any of the respective panels.

FIG. 3 illustrates another example of a conventional wiring scheme for a pair of clusters in a solar array. As with the example shown in FIG. 2, the panels P1-P12 are arranged in two rows 20A and 20B, with the panels are arranged in a landscape orientation. Again, a pair of wiring circuits 30A and 30B are arranged to connect the solar panels P1-P12 to a combiner box 50. However, unlike in the scheme of FIG. 1, in this scheme each panel cluster includes panels from each row 20A and 20B. A first cluster connected by circuit 30A includes panels P1-P3 of row 20A and panels P10-P12 of row 20B. Thus, the inter-module wiring arrangement 32A of circuit 30A connects panels P1-P3 of row 20A and panels P10-P12 of row 20B. Similarly, a second cluster connected by circuit 30B includes panels P4-P6 of row 20A and panels P7-P9 of row 20B. Thus, inter-module wiring arrangement 32B of circuit 30B connects panels P4-P6 of row 20A and panels P7-P9 of row 20B. Return wire harness 34A includes a first harness wire 40A connected to a pigtail lead 38A of panel P1 at one end of the inter-module wiring arrangement 32A, and a second harness wire 40B connected to a pigtail lead 38B of panel P12 at the other end of the inter-module wiring arrangement 32A. Similarly, return wire harness 34B includes a first harness wire 40C connected to a pigtail lead 38A of panel P4 at one end of the inter-module wiring arrangement 32B, and a second harness wire 40D connected to a pigtail lead 38B of panel P9 at the other end of the inter-module wiring arrangement 32B.

FIG. 4 illustrates another example of a conventional wiring scheme for a single cluster in a solar array. The arrangement shown in FIG. 4 is essentially identical to the arrangement shown in FIG. 1, except the solar panels P1-P6 are arranged in a portrait orientation, i.e., with the longer dimension of the individual panels extending perpendicular to the direction of the respective panel row.

FIG. 5 illustrates an example of a conventional wiring scheme for a pair of clusters in a solar array, wherein the panels are arranged in a portrait orientation. The arrangement shown in FIG. 5 is essentially identical to the arrangement shown in FIG. 3, except the solar panels P1-P12 are arranged in a portrait orientation rather than a landscape orientation.

Each example conventional wiring scheme shown in FIGS. 1-5 includes a number of harness wires 40 to connect one or more panel clusters to a combiner box. It may be advantageous to reduce or minimize the lengths of such harness wires between the panel clusters and combiner box, e.g., to reduce material costs and/or installation time.

SUMMARY

In one aspect of the invention, a solar power system may include a combiner module, a solar array connected to the combiner module and including multiple rows of solar panels, and multiple circuits connecting the solar panels of the solar array to the combiner module. Each circuit may include an inter-module wiring arrangement that connects individual solar panels to each other in series, and a return wiring arrangement that connects the inter-module wiring arrangement to the combiner module. The solar panels in each row of solar panels may be are wired to at least two of the circuits in a substantially alternating manner, such that within each row, individual solar panels that are not adjacent each other are wired directly in series to one circuit, with intervening solar panels in the row being wired to another circuit.

In another aspect of the invention, a method for wiring a solar power system may include forming a plurality of circuits to connect a solar array to a combiner module, the solar array having plurality of solar panels arranged in rows. The process of forming each circuit may include forming an inter-module wiring arrangement to connects individual solar panels to each other in series, and forming a return wiring arrangement to connect the inter-module wiring arrangement to the combiner module. Forming the inter-module wiring arrangements for the circuits may include wiring the solar panels in each row to at least two of the circuits in a substantially alternating manner, such that within each row, individual solar panels that are not adjacent each other are wired directly in series to one circuit, with intervening solar panels in the row being wired to another circuit.

In another aspect of the invention, a solar power system may include a combiner module, a row of solar panels connected to the combiner module, and a wiring circuit connecting the row of solar panels to the combiner module. The circuit may include an inter-module wiring arrangement that connects individual solar panels to each other in series, and a return wiring arrangement that connects the inter-module wiring arrangement to the combiner module. The inter-module wiring arrangement may be arranged such that at least some of the individual solar panels in the solar panel row are wired to each other in a substantially alternating manner, such that individual solar panels that are not adjacent each other are wired directly in series to each other.

DETAILED DESCRIPTION OF EXEMPLARY EMBODIMENTS

Figure 1:
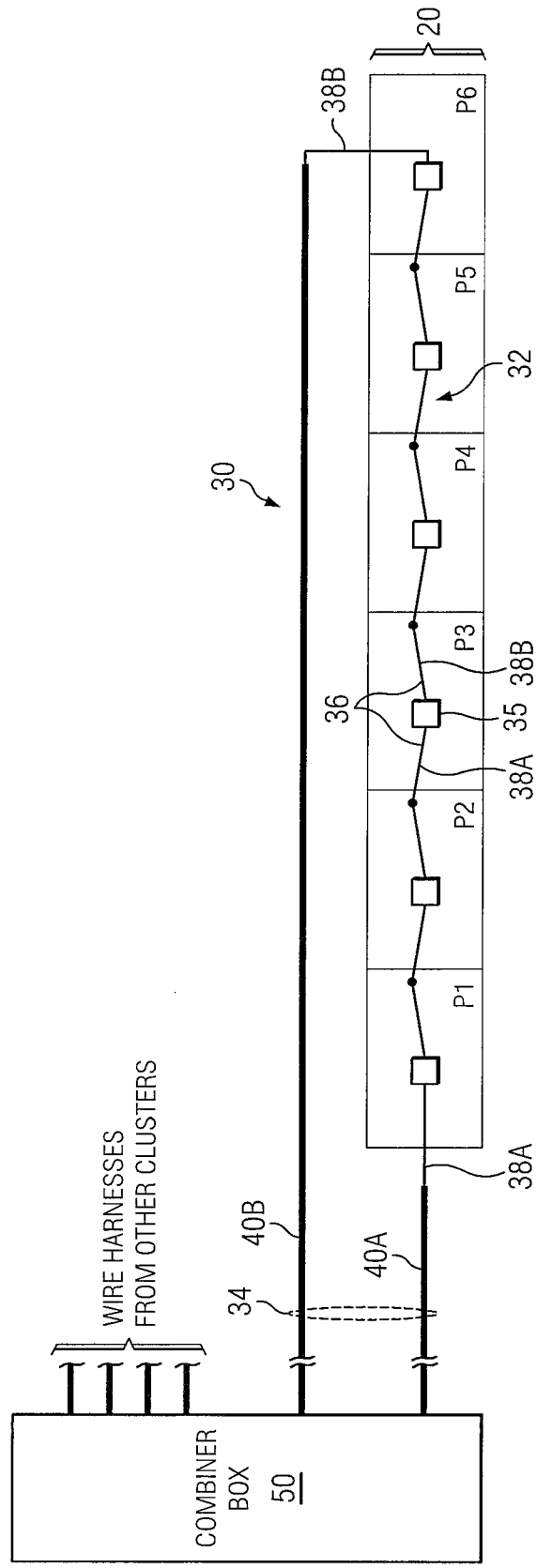
FIGS. 1-5 illustrate example conventional wiring schemes for connecting solar panel clusters to a combiner box.

The invention may be better understood by reading the following description of non-limiting, exemplary embodiments with reference to the attached drawings wherein like parts of each of the figures are identified by the same reference characters.

The invention relates to systems and methods for wiring solar power arrays, and in particular, to wiring schemes for connecting solar panel clusters to a combiner box. In some embodiments, the wiring scheme involves wiring solar panels into clusters that "overlap" each other, e.g., by coupling solar panels to different circuits in an alternating manner. Such wiring schemes may reduce or minimize the lengths of harness wires used to connect the panel clusters to a combiner box, which may reduce material costs and/or installation time, for example.

Figure 6:
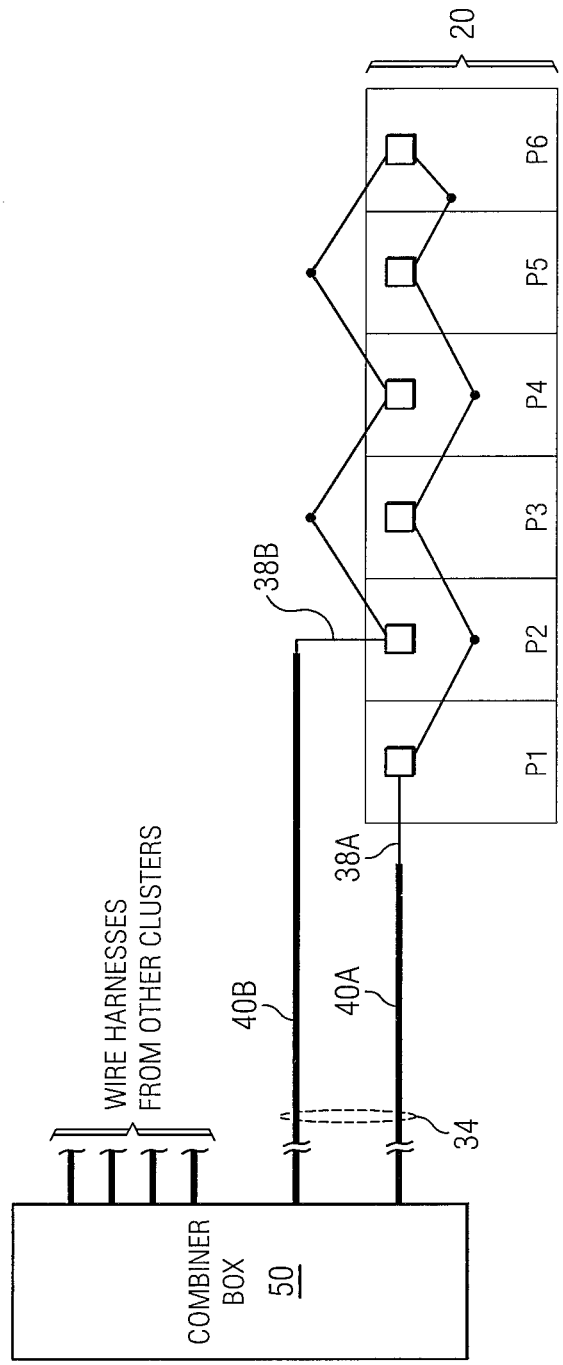
FIG. 6 illustrates an example wiring scheme for connecting a solar panel cluster to a combiner box, wherein the solar panels are arranged in a portrait layout, according to an example embodiment.

FIG. 6 illustrates an example wiring scheme for connecting a solar panel cluster to a combiner box, wherein the solar panels are arranged in a portrait layout, according to an example embodiment. In this example wiring scheme, 6 solar panels, labeled P1 through P6, are arranged in a row 20, and in a portrait orientation (i.e., with the longer dimension of the individual panels extending perpendicular to the direction of the respective panel row), similar to the panel layout shown in FIG. 4. A wiring circuit 30 is arranged to connect the solar panels P1-P6 to a combiner box 50.

As shown, wiring circuit 30 includes an inter-module wiring arrangement 32 that connects the solar panels P1-P6 to each other in series, and a return wire harness 34 that connects the inter-module wiring arrangement 32 to the combiner box 50. The inter-module wiring arrangement 32 is formed by connecting wiring pigtails 36 to each other to connect non-adjacent solar panels to each other in series, i.e., such that the solar panels are connected to circuit 30 in an alternating manner. Each pigtail lead 38A/38B of each solar panel is connected to a pigtail lead 38A/38B of a non-adjacent solar panel, or to a harness wire 40, with the exception of adjacent panels P5 and P6 that are connected to each other, as shown in FIG. 6. Return wire harness 34 includes a pair of harness wires 40 coupled to the ends of the inter-module wiring arrangement 32. Thus, return wire harness 34 includes a first harness wire 40A connected to a pigtail lead 38A of panel P1 at one end of the inter-module wiring arrangement 32, and a second harness wire 40B connected to a pigtail lead 38B of panel P2 at the other end of the inter-module wiring arrangement 32.

Figure 4:
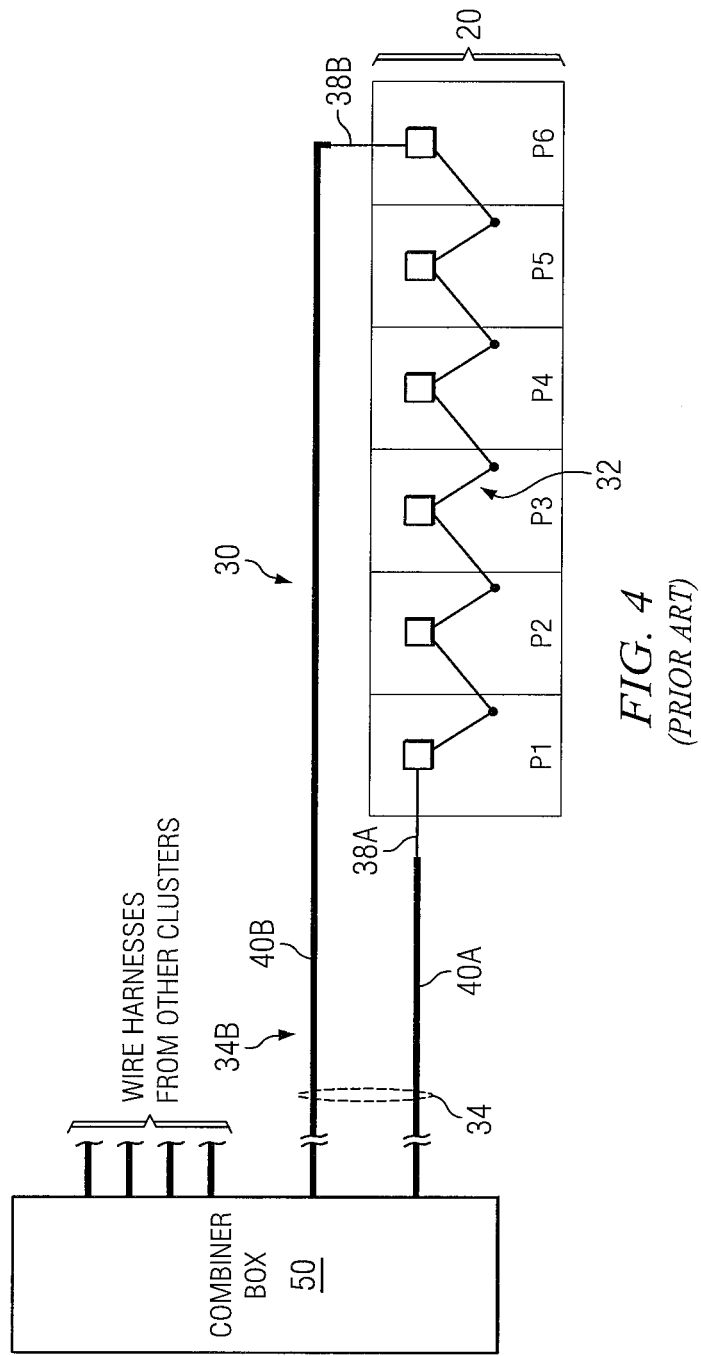

Thus, as shown in FIG. 6, the alternating arrangement of inter-module wiring arrangement 32 provides both ends of the wiring arrangements 32 near one end of the panel row 20 (at panels P1 and P2), such that harness wires 40A and 40B are coupled to near the end of panel row 20 nearest to combiner box 50. Such arrangement may reduce or minimize the total length of harness wires needed to connect the panel array to combiner box 50, as compared with conventional wiring schemes (e.g., as shown in FIG. 4).

It should be understood that any of the wiring discussed herein, including pigtail leads 38 and harness wires 40, may comprise any suitable type of wiring or electrical conductor for creating circuits to conduct current from the solar panels to combiner box 50.

It should be also be understood that the various system components discussed herein may be of any suitable size, shape, and type. Thus, solar panels may be of any suitable type, and may have any suitable size and/or shape. For example, in some embodiments, solar panels may be generally rectangular with any suitable dimensions, e.g., 3"×6", 1.5 ft×2.5 ft, 6 ft×4 ft, 6.2 ft×3.8 ft, or 4.1 ft×2.7 ft. Further, junction boxes 35 may be located at any suitable location on the respective solar panels. Further, pigtail leads 38 may have any suitable length. For example, in some embodiments, the length of each pigtail lead may be about ¾ the length of the height (i.e., longest) side of the respective solar panel. In some embodiments, the length of each pigtail lead may be about 3.6 ft, 3.8 ft, 4.1 ft, or 4.2 ft, for example.

Figure 7:
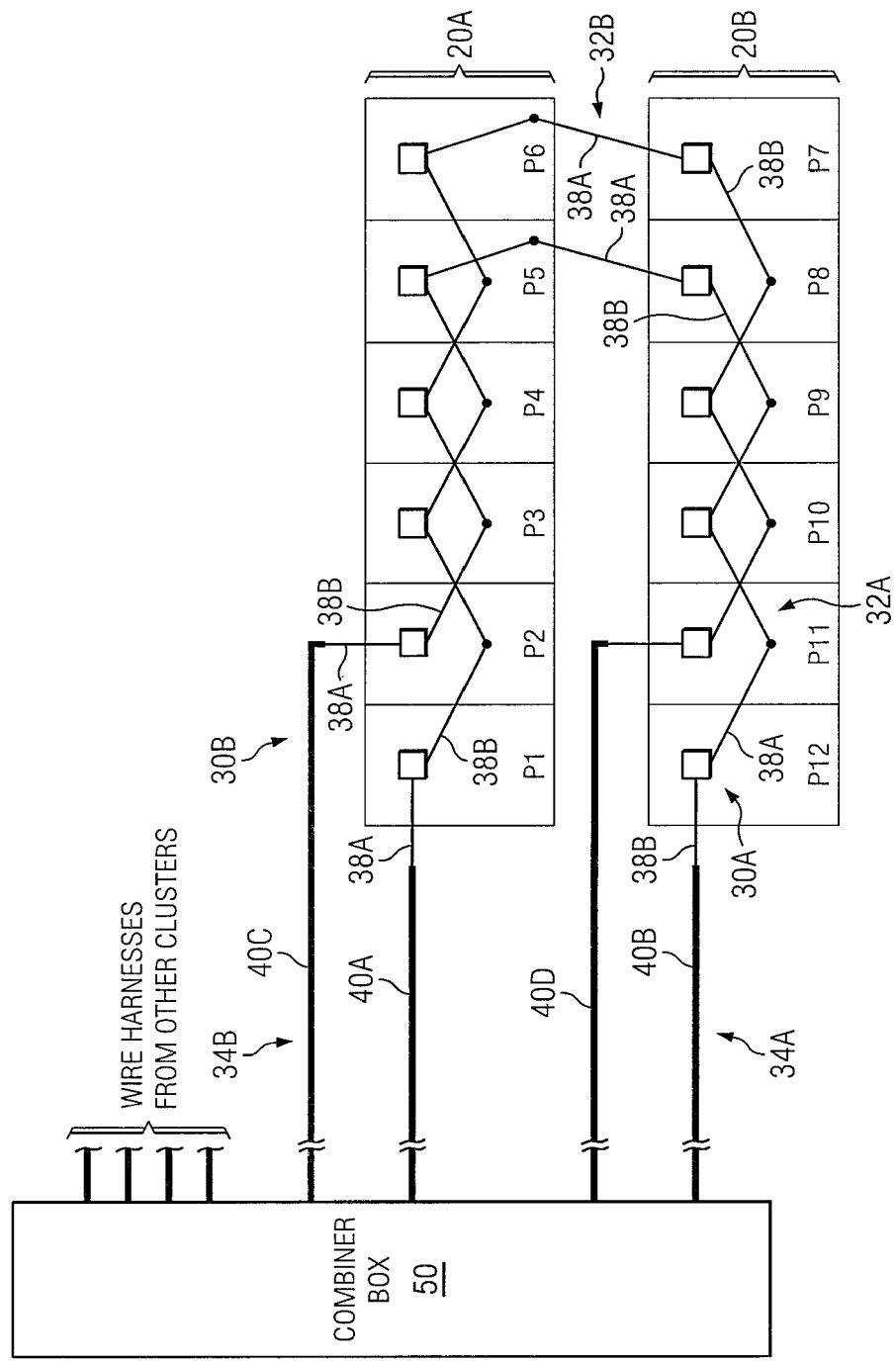
FIG. 7 illustrates an example wiring scheme for connecting a pair of solar panel clusters to a combiner box, wherein the solar panels are arranged in a portrait layout, according to an example embodiment.

FIG. 7 illustrates an example wiring scheme for connecting a pair of solar panel clusters to a combiner box, wherein the solar panels are arranged in a portrait layout, according to an example embodiment. In this example wiring scheme, a pair of wiring circuits are used for a pair of panel clusters, wherein each wiring circuit connects some of the panels of both panel clusters, as described below. Thus, this example scheme is different from the scheme shown in FIG. 6, in which a single wiring circuit corresponds to a single panel cluster.

In the example wiring scheme shown in FIG. 7, 12 solar panels, labeled P1 through P12, are arranged in two rows 20A and 20B, and in a portrait orientation (i.e., with the longer dimension of the individual panels extending perpendicular to the direction of the respective panel row), similar to the panel layout shown in FIG. 6. A pair of wiring circuits 30A and 30B are arranged to connect the solar panels P1-P12 to a combiner box 50. In this scheme, wiring circuit 30A is provided for a first panel cluster (panels P1, P3, P5, P8, P10, and P12), while wiring circuit 30B is provided for a second panel cluster (panels P2, P4, P6, P7, P9, and P11). Thus, the clusters may be said to "overlap" each other, as the panels in each row 20A and 20B are coupled to circuits 30A and 30B in an alternating manner, with no two adjacent panels being coupled to the same circuit 30A or 30B.

As shown, circuit 30A includes an inter-module wiring arrangement 32A that connects the solar panels of the first cluster (panels P1, P3, P5, P8, P10, and P12) to each other in series, and a return wire harness 34A that connects the inter-module wiring arrangement 32A to the combiner box 50. Similarly, circuit 30B includes an inter-module wiring arrangement 32B that connects the solar panels of the second cluster (panels P2, P4, P6, P7, P9, and P11) to each other in series, and a return wire harness 34B that connects the inter-module wiring arrangement 32B to the combiner box 50.

The inter-module wiring arrangement 32A/32B of each circuit 30A/30B is formed by connecting wiring pigtails 36—typically pre-connected to each solar panel—to each other to connect non-adjacent solar panels to each other in series, i.e., such that the solar panels are connected to circuits 30A and 30B in an alternating manner. Each pigtail lead 38A/38B of each solar panel P1-P12 is connected to a pigtail lead 38A/38B of a non-adjacent solar panel, or to a harness wire 40. Each return wire harness 34 includes a pair of harness wires 40 coupled to the ends of the respective inter-module wiring arrangement 32A/32B. Thus, return wire harness 34A includes a first harness wire 40A connected to a pigtail lead 38A of panel P1 at one end of the inter-module wiring arrangement 32A, and a second harness wire 40B connected to a pigtail lead 38B of panel P12 at the other end of the inter-module wiring arrangement 32A. Similarly, return wire harness 34B includes a first harness wire 40C connected to a pigtail lead 38A of panel P2 at one end of the inter-module wiring arrangement 32B, and a second harness wire 40D connected to a pigtail lead 38B of panel P11 at the other end of the inter-module wiring arrangement 32B.

Figure 5:
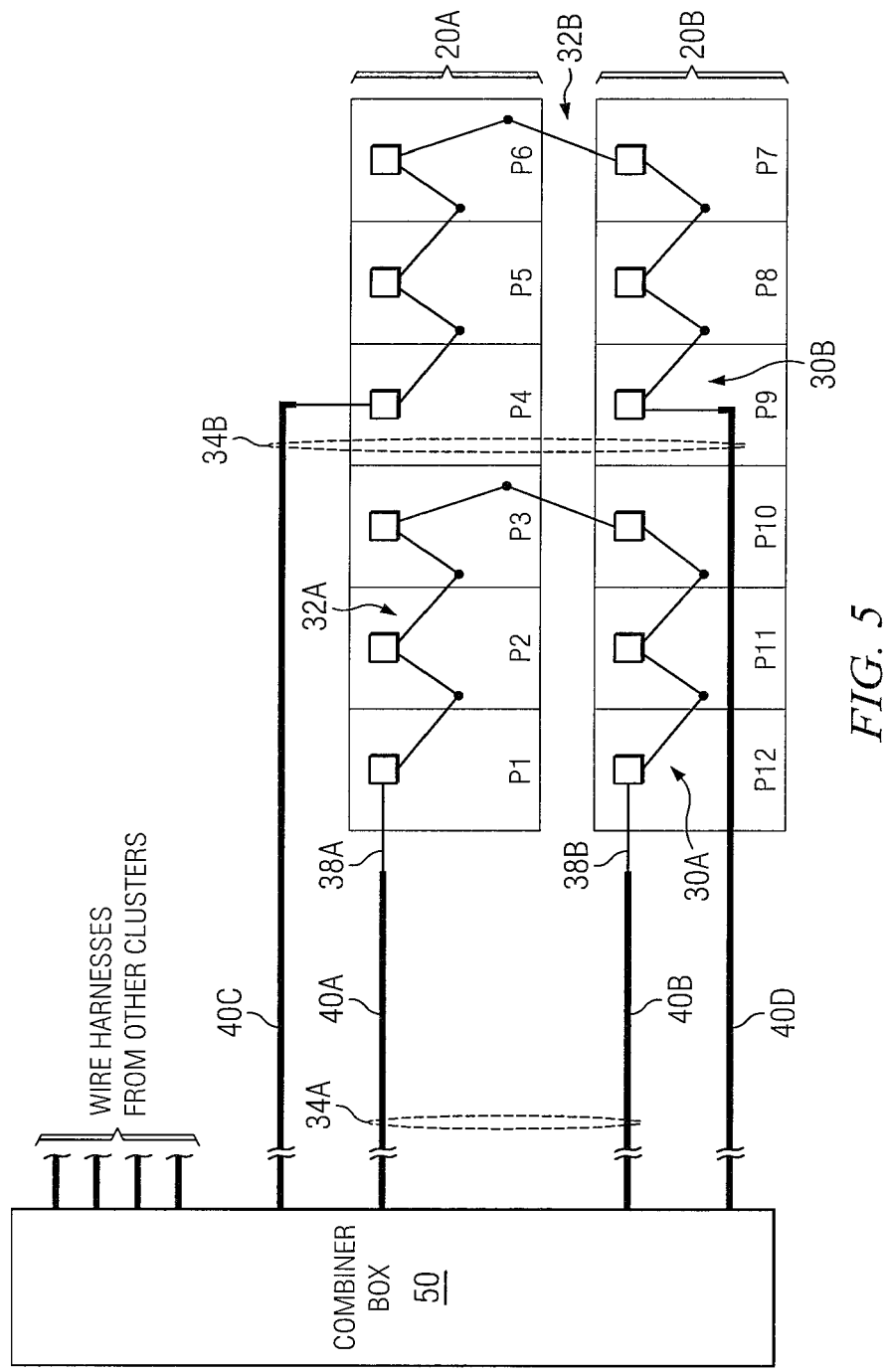

Thus, as shown in FIG. 7, the alternating arrangement of inter-module wiring arrangements 32A and 32B provides the ends of each inter-module wiring arrangements 32A and 32B near one end of the panel rows 20A and 20B. In particular, with this example arrangement, all four harness wires 40A-40D are coupled to the end panels of rows 20A and 20B (i.e., panels P1 and P12) or to the panels adjacent the end panels (i.e., panels 2 and 11). Coupling all four harness wires 40A-40D at one end of the panel array may reduce or minimize the total length of harness wires needed to connect the panel array to combiner box 50, as compared with conventional wiring schemes (e.g., as shown in FIG. 5).

Figure 8:
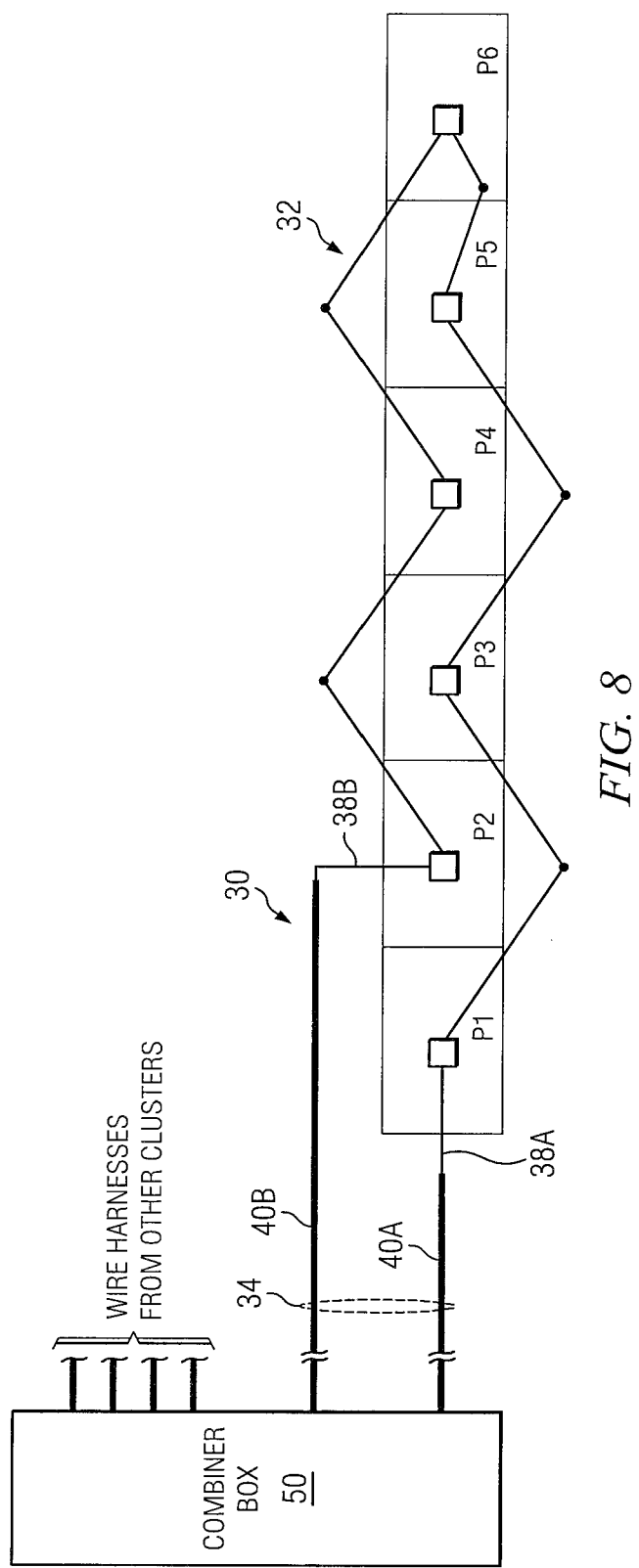
FIG. 8 illustrates an example wiring scheme for connecting a solar panel cluster to a combiner box, wherein the solar panels are arranged in a landscape layout, according to an example embodiment.

FIG. 8 illustrates an example wiring scheme for connecting a solar panel cluster to a combiner box, wherein the solar panels are arranged in a landscape layout, according to an example embodiment. The arrangement and wiring scheme is similar to that shown in FIG. 6, except that the solar panels are arranged in a landscape layout rather than a portrait layout. Again, coupling both harness wires 40A and 40B at one end of the panel row 20 (e.g., at panels P1 and P2 as shown in FIG. 8) may reduce or minimize the total length of harness wires needed to connect the panel row to combiner box 50, as compared with conventional wiring schemes (e.g., as shown in FIG. 1).

Figure 9:
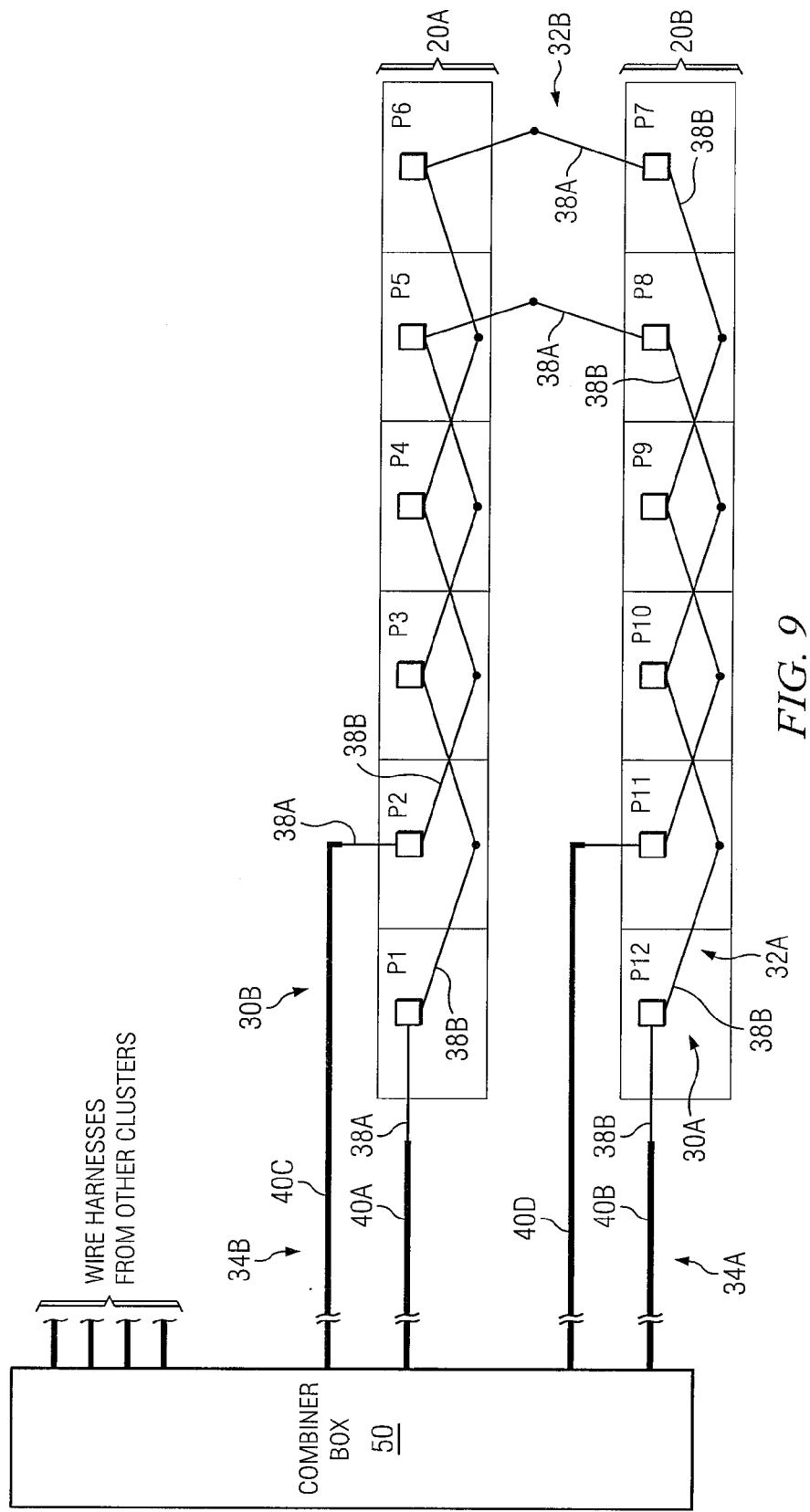
FIG. 9 illustrates an example wiring scheme for connecting a pair of solar panel clusters to a combiner box, wherein the solar panels are arranged in a landscape layout, according to an example embodiment.

FIG. 9 illustrates an example wiring scheme for connecting a pair of solar panel clusters to a combiner box, wherein the solar panels are arranged in a landscape layout, according to an example embodiment. As with the example wiring scheme shown in FIG. 7, in this example wiring scheme a pair of wiring circuits are used for a pair of panel clusters, wherein each wiring circuit connects some of the panels of both panel clusters, as described below. Thus, the example scheme of FIG. 9 is different from the scheme shown in FIG. 8, in which a single wiring circuit corresponds to a single panel cluster. Again, coupling all four harness wires 40A-40D at one end of the panel array may reduce or minimize the total length of harness wires needed to connect the panel array to combiner box 50, as compared with conventional wiring schemes (e.g., as shown in FIGS. 2 and 3).

For example, a test was performed by arranging solar panel arrays and wiring schemes according to the example conventional arrangements shown in FIGS. 1-5, and according to the example embodiments shown in FIGS. 6-9, with each array being spaced at the same distance from the combiner box 20, and then measuring the total lengths of harness wires 40 required in each arrangement/wiring scheme. The results of the test are shown below in Table 1.

TABLE 1

Figure 2:
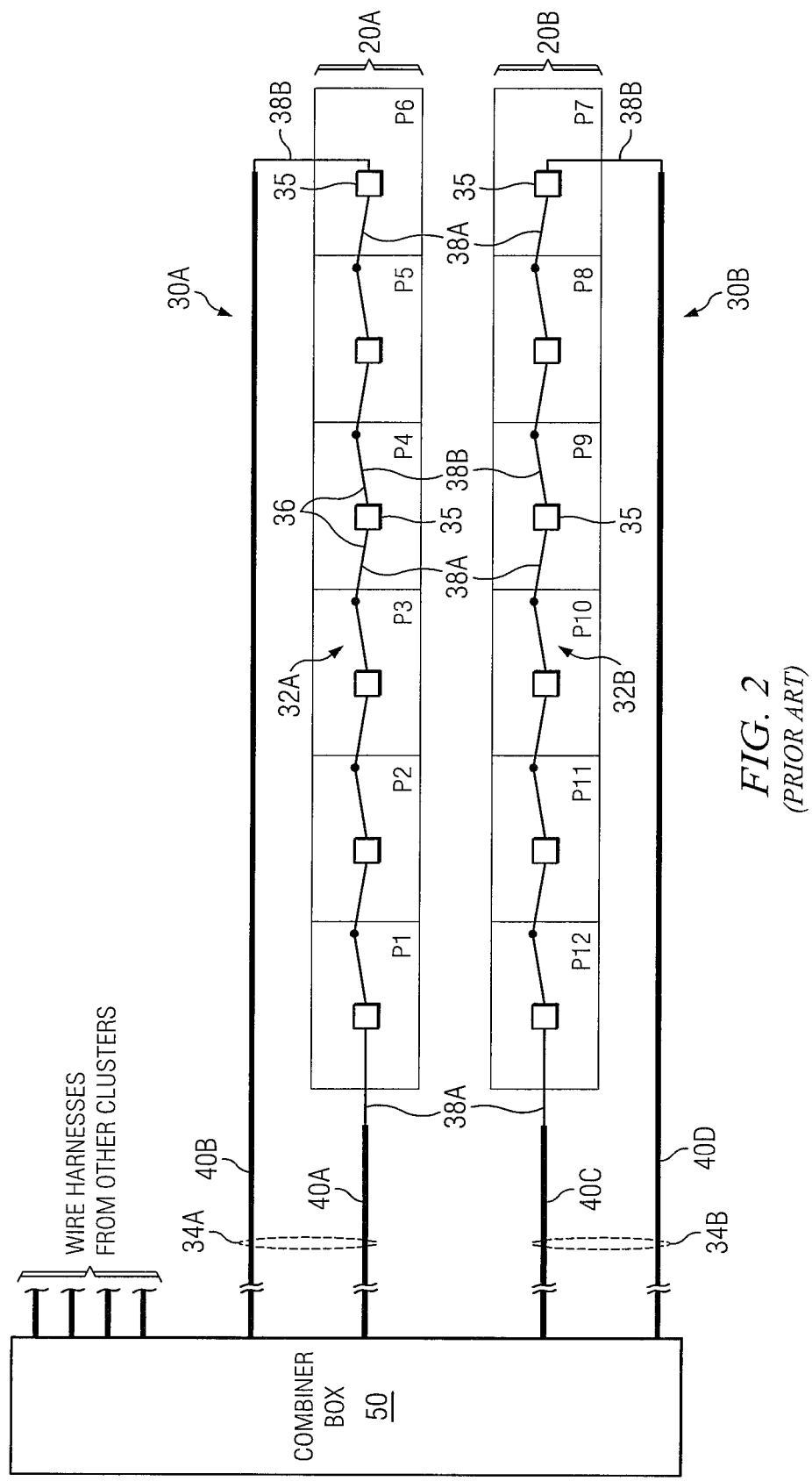
Figure 3:
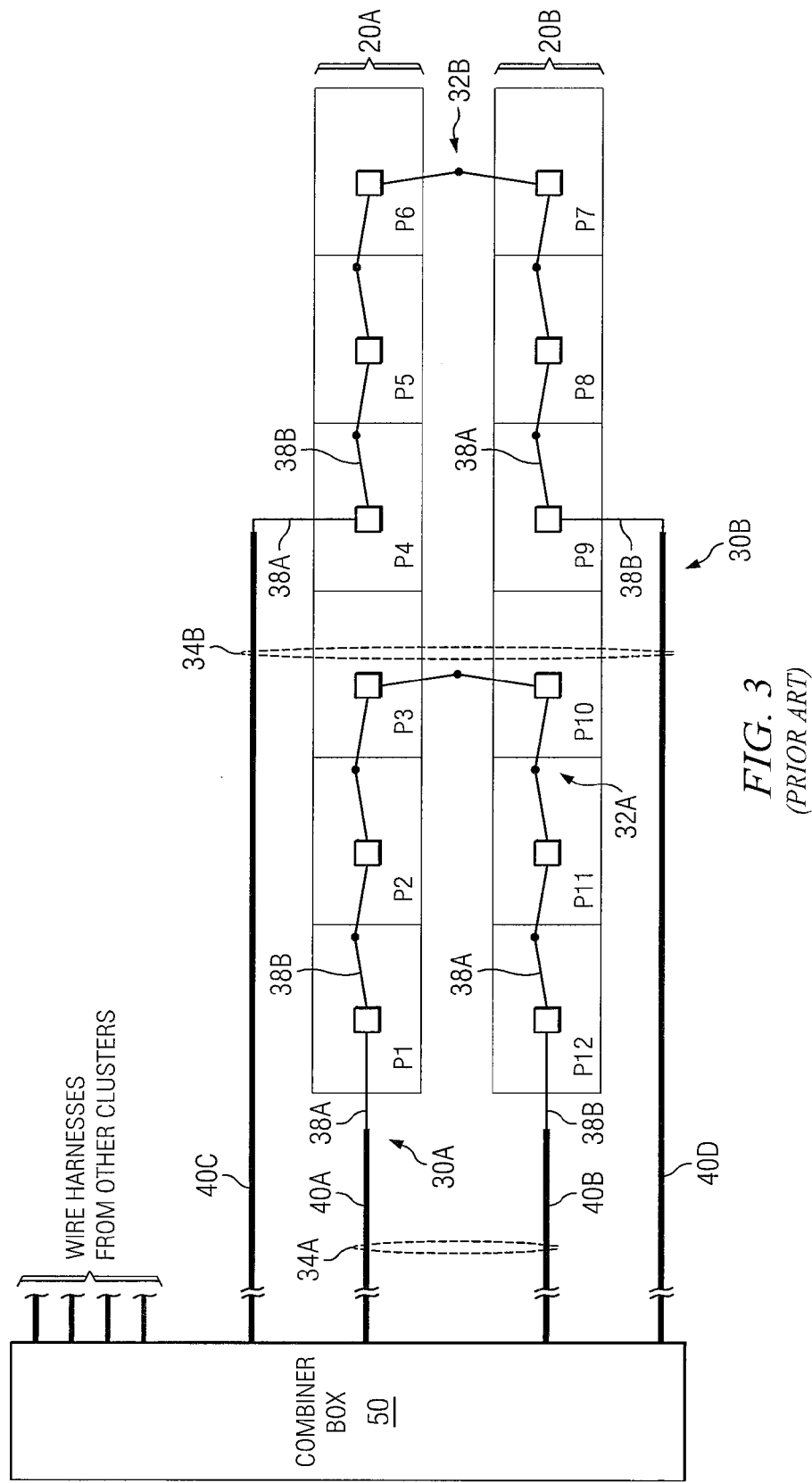

| Arrangement and wiring scheme shown in: | Number of panel clusters | Panel size | Panel orientation | Total length of harness wires per panel cluster |
| --- | --- | --- | --- | --- |
| FIG. 1 (prior art) | 1 | 37 inches × 65 inches | Landscape | 390 inches |
| FIG. 2 (prior art) | 2 | 37 inches × 65 inches | Landscape | 390 inches |
| FIG. 3 (prior art) | 2 | 37 inches × 65 inches | Landscape | 260 inches |
| FIG. 4 (prior art) | 1 | 37 inches × 65 inches | Portrait | 210 inches |
| FIG. 5 (prior art) | 2 | 37 inches × 65 inches | Portrait | 140 inches |
| FIG. 6 | 1 | 37 inches × 65 inches | Portrait | 70 inches |
| FIG. 7 | 2 | 37 inches × 65 inches | Portrait | 70 inches |
| FIG. 8 | 1 | 37 inches × 65 inches | Landscape | 130 inches |
| FIG. 9 | 2 | 37 inches × 65 inches | Landscape | 130 inches |

Thus, as shown in Table 1, the total length of harness wire needed for coupling panel clusters to a combiner box may be significantly reduced by employing the techniques discussed above (as compared to conventional arrangements), e.g., as shown in the example embodiments of FIGS. 6-9.

Therefore, the present invention is well adapted to attain the ends and advantages mentioned, as well as those that are inherent therein. The particular embodiments disclosed herein are illustrative only, as the invention may be modified and practiced in different but equivalent manners apparent to those having ordinary skill in the art and having the benefit of the teachings herein. While numerous changes may be made by those having ordinary skill in the art, such changes are encompassed within the spirit and scope of this invention as defined by the appended claims. Furthermore, no limitations are intended to the details of construction or design herein shown. It is therefore evident that the particular illustrative embodiments disclosed above may be altered or modified and all such variations are considered within the scope and spirit of the present invention.

What is claimed is:

1. A solar power system comprising:
a combiner module;
a solar array connected to the combiner module, the solar array comprising an array of solar panels arranged in at least one row;
at least two circuits connecting the solar panels of the solar array to the combiner module, the at least two circuits comprising a first circuit and a second circuit, each of the first circuit and the second circuit comprising:
an inter-module wiring arrangement that connects individual solar panels to each other in series; and
a return wiring arrangement that connects the inter-module wiring arrangement to the combiner module;
wherein a majority of solar panels in the first circuit are connected in series in an alternating manner to solar panels of the first circuit that are not adjacent and wherein a majority of solar panels in the second circuit are connected in series in an alternating manner to solar panels of the second circuit that are not adjacent.

2. The system according to claim 1, wherein:
the solar array comprises two rows of solar panels arranged substantially parallel to each other; and
wherein the solar panels in each row of solar panels are wired to the two circuits in a substantially alternating manner.

3. The system according to claim 1, wherein the inter-module wiring arrangement of each circuit comprises pigtail wiring pre-connected to each solar panel.

4. The system according to claim 3, wherein for a particular solar panel in a first row of the solar array, the pigtail wiring includes:
a first lead connected to a lead of a first non-adjacent solar panel in the first row; and
a second lead connected to a lead of a second non-adjacent solar panel in the first row;
such that the first non-adjacent solar panel, the particular solar panel, and the second non-adjacent solar panel are connected in series to the first circuit, with at least one solar panel of the second circuit positioned between the first non-adjacent solar panel and the particular solar panel.

5. The system according to claim 1, wherein the solar panels in each row are arranged in a portrait layout.

6. The system according to claim 1, wherein the solar panels in each row are arranged in a landscape layout.

7. The system according to claim 1, wherein no adjacent solar panels in the same row are wired to the same circuit.

8. The system according to claim 1, wherein:
the return wiring arrangement for each circuit is connected to either (a) a first solar panel of the at least one row or (b) a solar panel adjacent to the first solar panel of one of the at least one row.

9. The system according to claim 1, wherein:
the solar array comprises a first row of solar panels and a second row of solar panels extending along the same general direction, each of the first and second rows including a first solar panel at a first end of the respective row, a second solar panel adjacent the first solar panel, a last solar panel at the second end of the respective row;

the return wiring arrangement for the first circuit comprises a first return wire connecting the first solar panel of the first row to the combiner module, and a second return wire connecting the first solar panel of the second row to the combiner module; and the return wiring arrangement for the second circuit comprises a first return wire connecting the second solar panel of the first row to the combiner module, and a second return wire connecting the second solar panel of the second row to the combiner module.

10. The system according to claim 1, wherein:

the solar array comprises a first row of solar panels and a second row of solar panels extending along the same general direction, each of the first and second rows including a first solar panel at a first end of the respective row, a second solar panel adjacent the first solar panel, a last solar panel at the second end of the respective row;

the return wiring arrangement for the first circuit comprises a first return wire connecting the first solar panel of the first row to the combiner module, and a second return wire connecting the second solar panel of the second row to the combiner module; and the return wiring arrangement for the second circuit comprises a first return wire connecting the second solar panel of the first row to the combiner module, and a second return wire connecting the first solar panel of the second row to the combiner module.

11. A method for wiring a solar power system, comprising:

forming at least two circuits to connect a solar array to a combiner module, the at least two circuits comprising a first circuit and a second circuit, the solar array having a plurality of solar panels arranged in at least one row, wherein forming each of the first circuit and the second circuit comprises:
  forming an inter-module wiring arrangement to connect individual solar panels to each other in series; and
  forming a return wiring arrangement to connect the inter-module wiring arrangement to the combiner module;

wherein a majority of solar panels in the first circuit are connected in series in an alternating manner to solar panels of the first circuit that are not adjacent and wherein a majority of solar panels in the second circuit are connected in series in an alternating manner to solar panels of the second circuit that are not adjacent.

12. The method according to claim 11, wherein:

the solar array comprises two rows of solar panels arranged substantially parallel to each other; and wherein forming the inter-module wiring arrangements of the two circuits includes wiring the solar panel in each row to the two circuits in a substantially alternating manner.

13. The method according to claim 11, wherein the inter-module wiring arrangement of each circuit comprises pigtail wiring pre-connected to each solar panel.

14. The method according to claim 13, comprising wiring a particular solar panel in a first row to the first circuit by:
  connecting a first lead of the particular solar panel to a lead of a first non-adjacent solar panel in the first row; and
  connecting a second lead of the particular solar panel to a lead of a second non-adjacent solar panel in the first row;
  such that the first non-adjacent solar panel, the particular solar panel, and the second non-adjacent solar panel are connected in series to the first circuit, with at least one solar panel of the second circuit positioned between the first non-adjacent solar panel and the particular solar panel, and at least one solar panel of the second circuit positioned between the particular solar panel and the second non-adjacent solar panel.

15. The method according to claim 11, wherein no adjacent solar panels in the same row are wired to the same circuit.

16. The method according to claim 11, wherein:

forming the return wiring arrangement for each circuit comprises connecting the combiner module to either (a) a first solar panel of one of the row or (b) a solar panel adjacent to the first solar panel of the row.

17. A solar power system comprising:

a combiner module;

a row of solar panels connected to the combiner module;

a wiring circuit connecting the row of solar panels to the combiner module, the circuit including:
  an inter-module wiring arrangement that connects individual solar panels to each other in series; and
  a return wiring arrangement that connects the inter-module wiring arrangement to the combiner module;

wherein the inter-module wiring arrangement is arranged such that a subset of the solar panels are wired in an alternating manner such that the solar panels in the subset are wired directly in series to solar panels of the row that are not adjacent.

18. The system according to claim 17, wherein the inter-module wiring arrangement comprises pigtail wiring pre-connected to each solar panel.

19. The system according to claim 18, wherein for a particular solar panel in the solar panel row, the pigtail wiring includes:
  a first lead connected to a lead of a first non-adjacent solar panel in the solar panel row; and
  a second lead connected to a lead of a second non-adjacent solar panel in the solar panel row;
  such that the first non-adjacent solar panel, the particular solar panel, and the second non-adjacent solar panel are connected directly together in series.

20. The system according to claim 17, wherein:

the row of solar panels extends from a first solar panel at a first end of the row to a last solar panel at a second end of the row; and the return wiring arrangement is connected at the first end to the first solar panel and at a second end to a second solar panel adjacent to the first solar panel.

* * * * *